(12) United States Patent
Eun et al.

(10) Patent No.: US 7,348,267 B2
(45) Date of Patent: Mar. 25, 2008

(54) FLASH MEMORY AND METHOD OF FABRICATING THE SAME

(75) Inventors: Dong-Seog Eun, Suwon-si (KR); Sung-Hun Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/327,321

(22) Filed: Jan. 9, 2006

(65) Prior Publication Data

US 2006/0154419 A1    Jul. 13, 2006

(30) Foreign Application Priority Data

Jan. 13, 2005    (KR)    .................... 10-2005-0003356

(51) Int. Cl.
*H01L 21/8247*    (2006.01)
(52) U.S. Cl. .............................. 438/593; 257/E21.179
(58) Field of Classification Search ........ 438/257–267, 438/593–594; 257/E21.179
See application file for complete search history.

(56) References Cited

U.S. PATENT DOCUMENTS

| 4,159,917 | A | * | 7/1979 | Gluck ........................ 438/477 |
|---|---|---|---|---|
| 5,767,005 | A | * | 6/1998 | Doan et al. .................. 438/593 |
| 5,970,364 | A | * | 10/1999 | Huang et al. ................ 438/445 |
| 6,165,853 | A | * | 12/2000 | Nuttall et al. ............... 438/296 |
| 6,284,637 | B1 | | 9/2001 | Chhagan et al. |
| 6,537,879 | B2 | | 3/2003 | Bez et al. |
| 2005/0255654 | A1 | * | 11/2005 | Lee et al. .................... 438/264 |

FOREIGN PATENT DOCUMENTS

| JP | 07058221 | * | 3/1995 |
|---|---|---|---|
| KR | 20020090749 | * | 12/2002 |
| KR | 1020030048958 A | | 6/2003 |
| KR | 1020040057512 A | | 7/2004 |

* cited by examiner

*Primary Examiner*—Richard A. Booth
(74) *Attorney, Agent, or Firm*—Volentine & Whitt, PLLC

(57) ABSTRACT

A method of fabricating a flash memory device produces a device that has a small cell area and yet a high coupling ratio. First, a basic structure is provided that includes a substrate, a field isolation film protruding from the substrate, and floating gates disposed on the substrate on opposite sides of the floating gate. A first etch process is performed to remove a portion of the field isolation film and thereby expose upper portions of the floating gates. Then, a second etch process is performed to knock off the edges of the floating gates. Thus, a large amount of space is secured between the floating gates for a dielectric film and a control gate.

15 Claims, 6 Drawing Sheets

FLASH MEMORY AND METHOD OF FABRICATING THE SAME

BACKGROUND OF THE INVENTION

Field of the Invention

The present invention relates to semiconductor memory devices. More particularly, the present invention relates to a flash memory device and to a method of fabricating a flash memory device.

There is a growing demand for semiconductor memory devices that are more highly integrated, e.g., which have cell areas that are more and more compact. One such semiconductor memory device is a flash memory. A flash memory includes a floating gate disposed over a substrate, a tunnel oxide film interposed between the floating gate and the substrate, a dielectric film stacked on the floating gate, and a control gate disposed on the dielectric film. The most important technical aspect of fabricating highly integrated semiconductor memory devices of this kind is to maintain topological alignment between the various layers constituting the device. In the case of a flash memory cell, pitting may occur in the active region of the cell or malfunctions may occur between adjacent cells if an active region of a cell is not aligned precisely with the floating gate of the cell. Flash memories having self-aligned floating gates have been proposed as a means to obviate such potential problems.

FIGS. 1A through 1E illustrate conventional steps for fabricating a flash memory device.

As shown in FIG. 1A, a pad oxide film 13 and a nitride film 15 are formed on a substrate 11. Subsequently, trenches 16 are formed in the resultant structure using a shallow trench isolation (STI) process.

Next, as shown in FIG. 1B, a high density plasma (HDP) oxide film is formed on the structure. Then, the structure is subjected to a chemical-mechanical polishing process to form field isolation films 21 that isolate active regions from one another.

As shown in FIG. 1C, an etch process is carried out using the pad oxide film 13 as an etch stop layer. As a result, the pad nitride film 15 is removed but the field isolation films 21 and the pad oxide film 13 remain on the substrate 11. In addition, a capping layer 23 is formed over the resultant structure.

Next, as shown in FIG. 1D, an etch process is carried out, using the top surface of the semiconductor substrate 11 as an etch stop, to pattern the field isolation films 21 and remove both the pad oxide film 13 and the capping layer 23. In particular, the upper portions of the field isolation films 21 are patterned so as to each have the shape of a nipple. Then, floating gates 27 are formed as separated from each other by the field isolation films 21.

Finally, as shown in FIG. 1E, upper portions of the field isolation films 21 between the floating gates 27 are etched, and a dielectric film 29 is formed thereon. Subsequently, a polysilicon layer 31 is deposited on the dielectric film 29. The polysilicon layer 31 will be processed to form the control gates.

In fabricating such a structure, if the cell areas were minimized, the pitch between the field isolation films 21 would be reduced and hence, the portions of the dielectric film 29 would adhere to each other as shown in FIG. 2. That is, no spaces would exist for control gates between the respective portions of the dielectric film 29, and only the upper portions of the floating gates would face the control gates. The coupling ratio, which is the ratio between a voltage applied to the control gate and the voltage induced at the floating gate of a flash memory having the structure shown in FIG. 2, is small and thus, is more prone to give rise to program or erasing errors during operation.

SUMMARY OF THE INVENTION

An object of the present invention is to provide a method of fabricating a flash memory device having a high coupling ratio.

Likewise, another object of the present invention is to provide a flash memory device having a small cell area and yet a relatively high coupling ratio.

According to one aspect of the invention, floating gates are provided on a substrate on opposite sides of a field isolation film protruding from the substrate, and then two discrete etching processes are carried out. First, the field isolation film is etched to remove an upper portion thereof and, as a result, expose upper portions of the floating gates. Subsequently, the exposed upper portions of the floating gates are etched and preferably, at the same time, additional upper portions of the field isolation films are removed. As a result, a large amount of space is provided between opposing sidewalls of the floating gates. Therefore, when the control gates are formed on the floating gates, the area over which the floating and control gates face each other is relatively large. Thus, the coupling ratios are correspondingly great and the flash memory device has a superior programming or erasing characteristic.

The first etch process, carried out to reduce the thickness of the field isolation film, may have an etch selectivity so that the field isolation film is etched without etching the floating gates. The second etch process need not be a selective process and can be used to knock off the upper edges of the floating gates as well as further reduce the thickness of the field isolation film. That is, the second etch process uses an etchant capable of removing the insulating material of the field isolation film and the conductive material, such as the polysilicon, forming the floating gates.

According to still another aspect of the present invention, a flash memory device includes a substrate, and a floating gate disposed over the substrate, wherein the sidewalls of the floating gate extend vertically at the lower portion of the floating gate, and the sidewalls of the floating gate are inclined relative to the vertical at the upper portion of the floating gate. Thus, the upper portion of the floating gate is narrower than the lower portion thereof as taken in a direction essentially parallel to the substrate. In addition, a tunnel oxide film is interposed between the lower portion of the floating gate and the substrate. A dielectric film is stacked on the floating gate so as to cover the upper surface of the floating gate and sidewalls of the floating gate. A control gate is disposed on the dielectric film and will face both the upper surface of the floating gate and the sidewalls of the floating gate.

BRIEF DESCRIPTION OF THE DRAWINGS

These and other objects, features and advantages of the present invention will become more apparent from the following detailed description of the preferred embodiments thereof, together with accompanying drawings. In the drawings.

DETAILED DESCRIPTION OF PREFERRED EMBODIMENTS

Figure 1A:
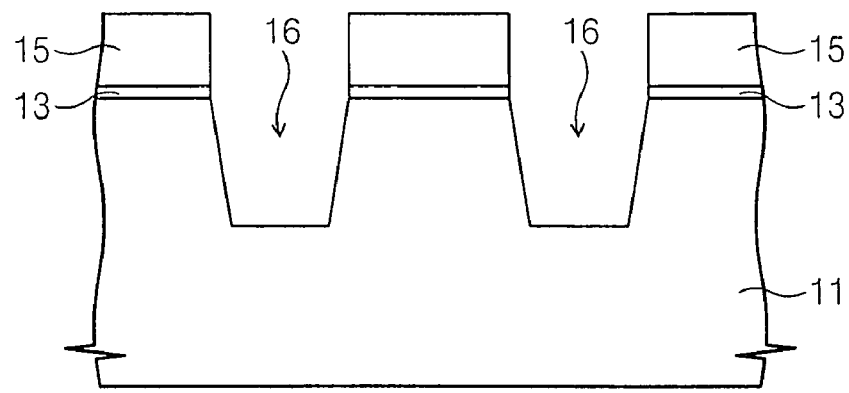
FIGS. 1A through 1E are sectional views of a substrate illustrating prior art steps of fabricating a flash memory device.
Figure 1B:
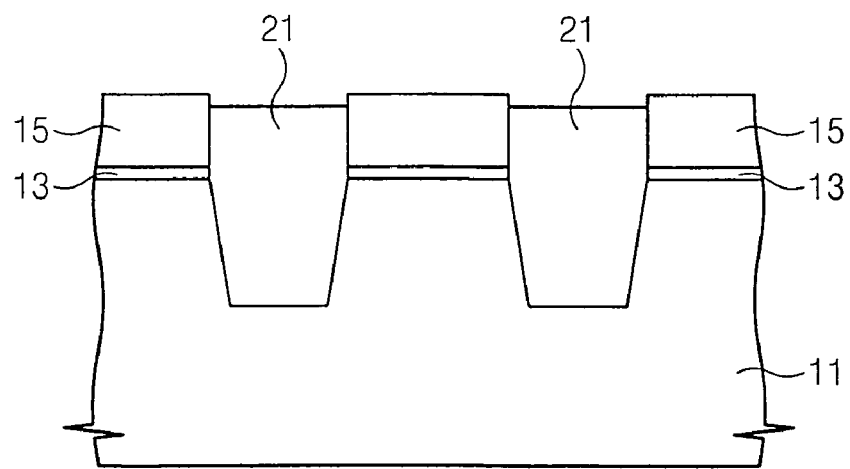
Figure 1C:
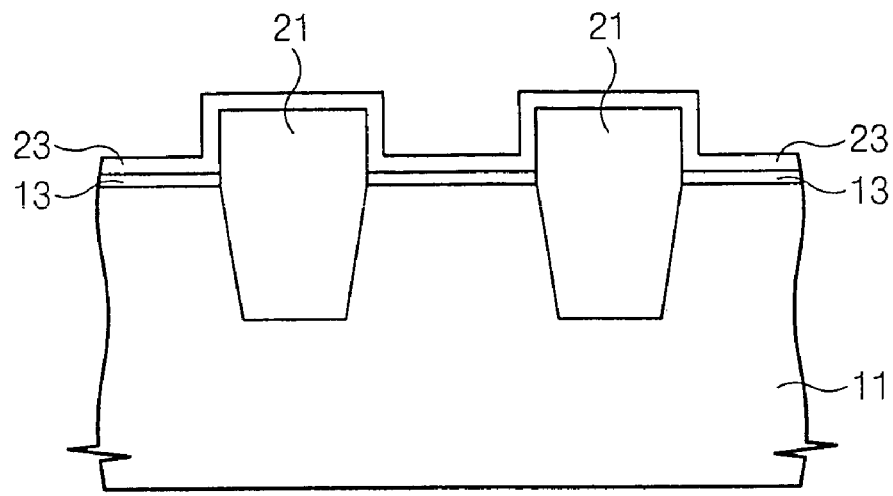
Figure 1D:
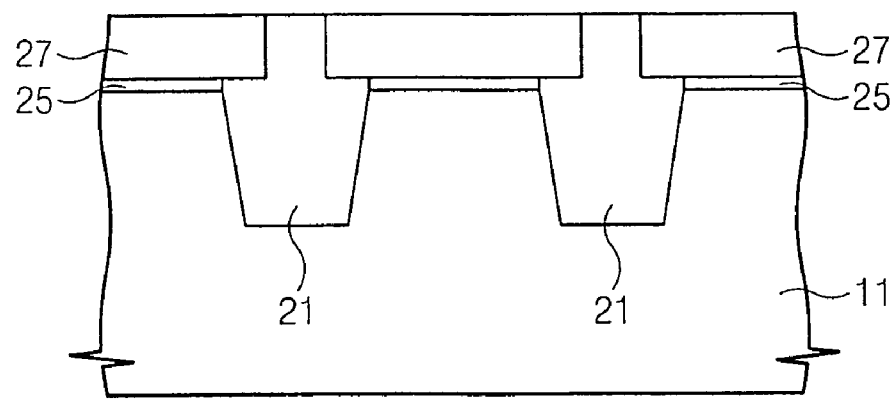
Figure 1E:
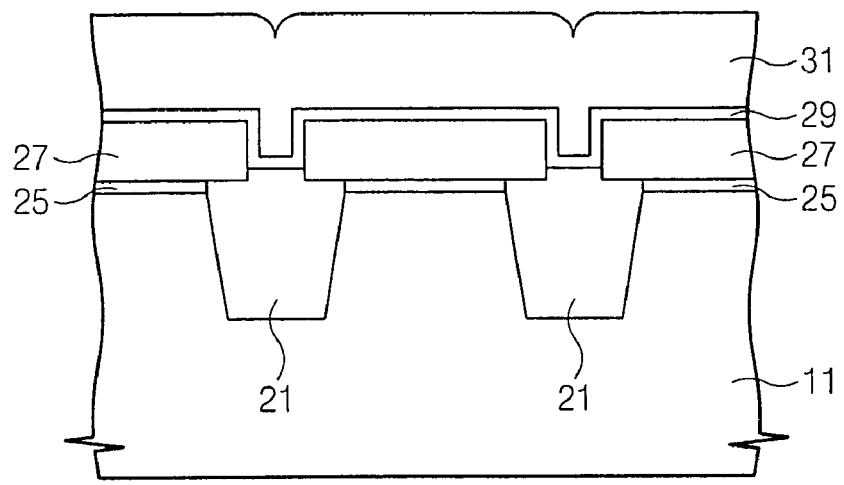
Figure 2:
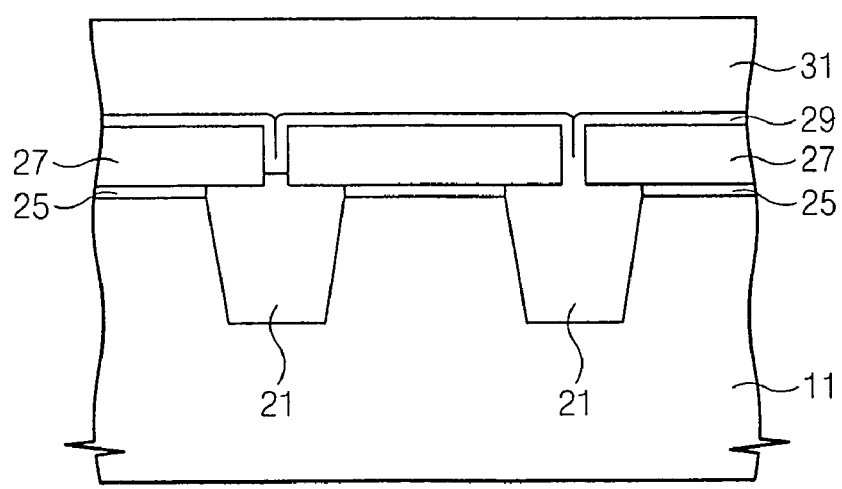
FIG. 2 is a sectional view of a flash memory device fabricated according to the method of the prior art.

The present invention will be described below in more detail with reference to FIGS. 3A-3F. In the drawings, the thickness of layers and regions are exaggerated for clarity. It will also be understood that when a layer is referred to as being "on" another layer or substrate, such a description refers to the layer in question being disposed either directly on the other layer or substrate, or intervening layers being present therebetween. Also, like numerals designate like elements throughout the drawings.

Figure 3A:
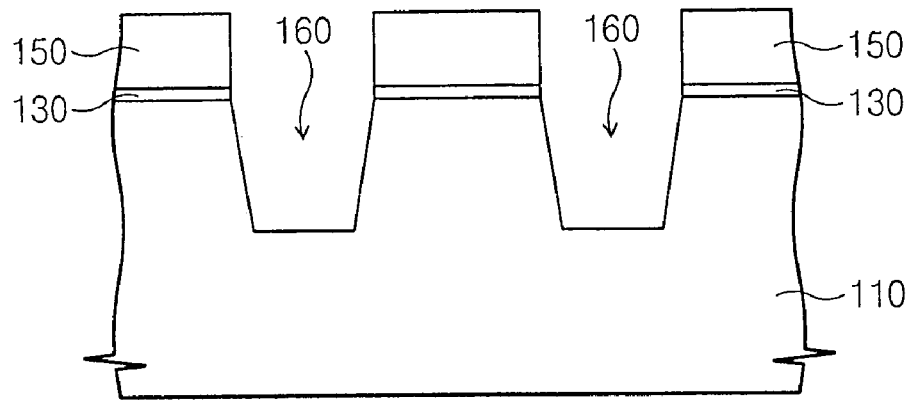
FIGS. 3A through 3F are sectional views of a substrate illustrating a method of fabricating a flash memory device in accordance with the present invention.

Referring first to FIG. 3A, a pad oxide film 130 and a pad nitride film 150 are formed on a substrate 110 in sequence. More specifically, the pad oxide film 130 is formed by means of a dry or wet oxidation process that treats or cures crystalline defects at the surface of the substrate 110. The pad nitride film 150 is generally formed of silicon nitride. Also, the thickness of the pad nitride film 150 dictates the configuration of the floating gates. Therefore, the pad nitride film 150 is formed to a thickness sufficient to produce a desired coupling ratio. Subsequently, the pad nitride film 150, the pad oxide film 130, and the substrate 110 are patterned to form trenches 160. Active regions are confined between the trenches 160.

Figure 3B:
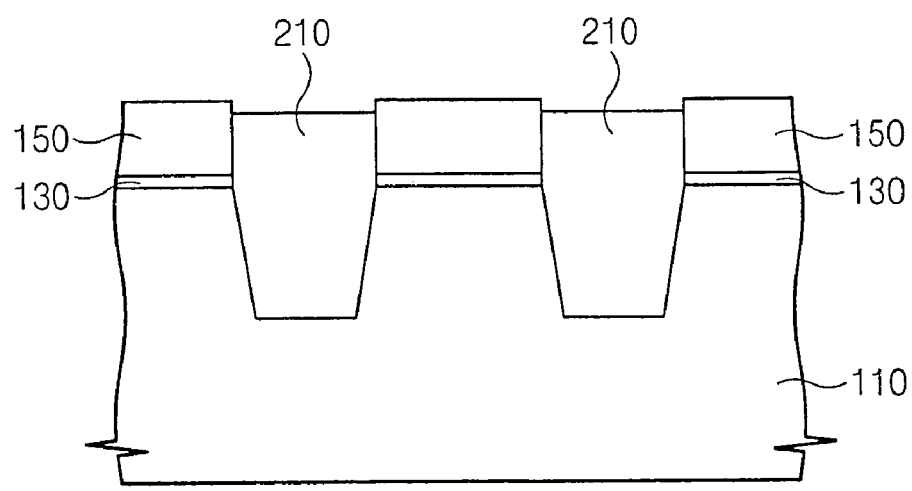

Next, referring to FIG. 3B, the trenches 160 are filled with an HDP oxide or an undoped silicate glass (USG), and the resultant structure is planarized by CMP until field isolation films 210 of the HDP oxide or USG are formed in the trenches 160, respectively. At this time, a cleaning process may also be preformed to remove any portions of the field isolation films 210 remaining on the pad nitride films 150. Such a cleaning process may be performed by exposing the structure to hydrofluoric acid (HF) or a buffered oxide etchant (BOE; a solution comprising a mixture of hydrofluoric acid (HF) and ammonium fluoride ($NH_4F$) in a ratio of 100:1 or 300:1). This process results in reducing the level of the upper surface of the field isolation films 210 to beneath that of the pad nitride films 150 by a predetermined amount. Subsequently, the pad oxide and nitride films 130 and 150 are removed by means of a wet etch process.

Figure 3C:
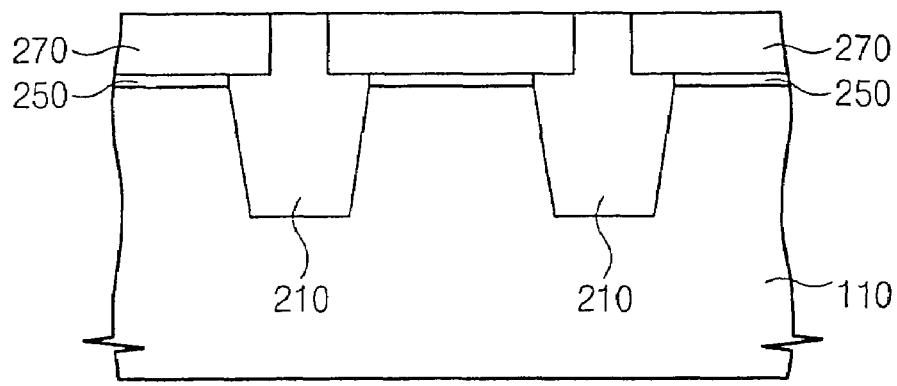

Referring to FIG. 3C, the wet etching of the pad oxide and nitride films 130 and 150 also reduces the height and width of the upper portions of the field isolation films 210. Then, a predetermined wet or dry etch is carried out to form a mask in the form of an oxide film (not shown) on the exposed surface of the substrate 110, and selective ion implantation processes are carried out over the entire surface of the resultant structure to form wells (not shown) and impurity regions (not shown) within the active regions. Next, the mask (oxide film) is removed and a tunnel oxide film 250 is formed on the substrate 110. A polysilicon layer is then formed on the tunnel oxide film 250. A CMP process is carried out using the upper portions of the field isolation films 210 as etch stop layers to form floating gates 270 from the polysilicon layer.

Figure 3D:
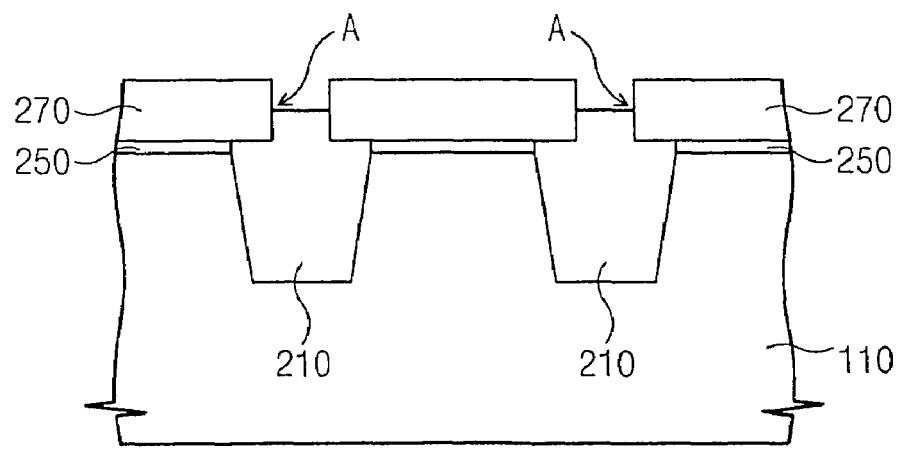

Subsequently, as illustrated in FIG. 3D, the upper portions of the field isolation films 210 are etched until the upper surfaces thereof are disposed 50~200 Å above the bottom of the floating gates 270, using hydrofluoric acid (HF) or a BOE. As a result, upper portions of the sidewalls of the floating gates 270 are exposed.

Figure 3E:
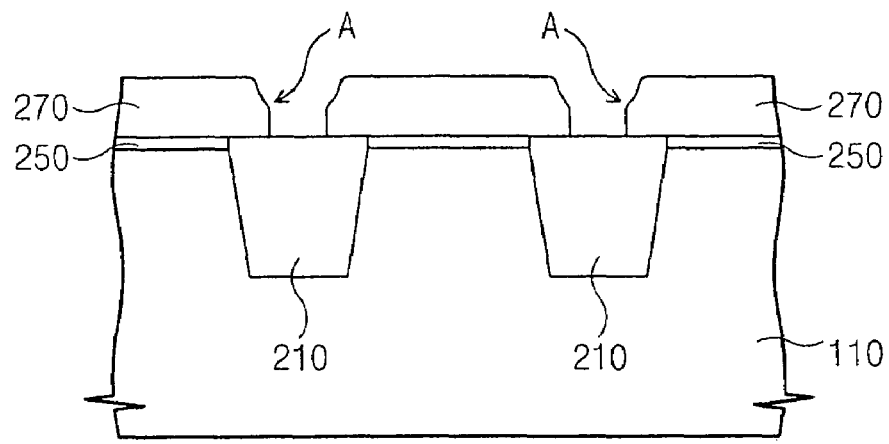

Next, referring to FIG. 3E, the field isolation films 210 are etched, using a standard cleaning (SC-1) solution (ammonium hydroxide ($NH_4OH$), hydrogen peroxide ($H_2O_2$), and pure water ($H_2O$) mixed in a ratio of 1:1:5 or 1:4:20), until the upper surfaces of the field isolation films reach the level of the upper surface of the substrate 110. The hydrogen peroxide ($H_2O_2$) contained in the SC-1 solution functions to oxidize the polysilicon layer.

Accordingly, as is also illustrated in FIG. 3E, as the thickness of the field isolation films 210 is reduced, the upper edges of the floating gates 270 are removed by the hydrogen peroxide. As a result, the upper portions of the floating gates 270 slope downwardly (at locations A) towards the field isolation films 210. That is, the protrusions of the field isolation films 210 are completely removed, and at least portions of the sidewalls of the floating gates 270 become inclined, thereby securing more space between the floating gates 270.

In performing such an additional etch process, preferably the peripheral regions outside the active regions are masked to prevent such peripheral regions from being etched. If not, sidewalls of gate electrodes disposed in the peripheral regions could be etched, which would significantly degrade the operational characteristics of the flash memory device.

Figure 3F:
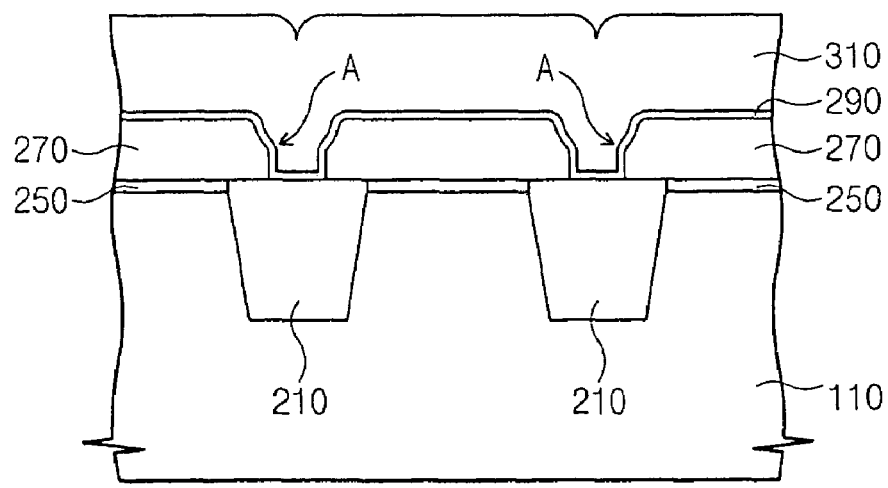

Referring to FIG. 3F, a dielectric film 290 is formed on the entire resultant structure. In general, the dielectric film 290 is an oxynitride-oxide (ONO) film. Then, a polysilicon layer 310 is formed on the dielectric film 290. Then, the polysilicon layer 310 is patterned to form the control gates. Alternatively, stacked polysilicon and silicide layers may be formed on the dielectric film 290 instead of the polysilicon layer 310.

In any case, a relatively large amount of space is provided to accommodate the dielectric film 290 because the upper portions of the floating gates 270 are narrower than the lower portions thereof. Therefore, the control gates will face the sidewalls of the floating gates 270 in addition to the upper surfaces thereof. Accordingly, the flash memory device can have a compact cell area and yet a relatively high coupling ratio. That is, the present invention is advantageous in that it enhances the programming or erasing characteristics of flash memory devices.

Finally, although the present invention has been described above in connection with the preferred embodiments thereof, the present invention is not so limited. Rather, various substitutions, modifications and changes may be made thereto, as will be apparent to those skilled in the art, without departing from the true spirit and scope of the invention as defined by the appended claims.

What is claimed is:

1. A method of fabricating a flash memory device, comprising:
providing a basic structure including a substrate, and a field isolation film protruding from the substrate;
forming a first conductive film on the substrate and planarizing the first conductive film to form floating gates on opposite sides of the field isolation film;
subsequently performing a first etch process that reduces the thickness of the field isolation film to expose upper portions of the floating gates;
while the upper portions of the floating gates are exposed, performing a second etch process that is different from said first etch process, wherein said second etch process comprises knocking off upper edges of each of the floating gates, at which sidewalls of the floating gate intersect an upper surface thereof, such that at least upper portions of the sidewalls of each of the floating gates becomes sloped; and subsequently forming a dielectric film and a second conductive film in sequence on the resultant structure.

2. The method as set forth in claim 1, wherein the providing of the basic structure comprises:

forming pad oxide and nitride films on the substrate;

patterning the pad oxide film, the pad nitride film, and the substrate to form a trench that extends through the oxide and nitride films;

filling the trenches with material insulating material constituting the field isolation film; and subsequently removing the pad oxide and nitride films.

3. The method as set forth in claim 1, wherein the first etch process has an etch selectivity between the material of the field isolation film and the material of the first conductive film, whereby the first etch process selectively etches the field isolation film without etching the floating gates.

4. The method as set forth in claim 1, wherein the first etch process is terminated before the upper surface of the field isolation film reaches the bottom of the floating gates.

5. The method as set forth in claim 1, wherein the first etch process comprises etching the field isolation film with a fluoric acid.

6. The method as set forth in claim 1, wherein the first etch process comprises etching the field isolation film with hydrofluoric acid and ammonium fluoride in a ratio of 100:1 to 300:1.

7. The method as set forth in claim 1, wherein the second etch process comprises etching the field isolation film with ammonium hydroxide, hydrogen peroxide, and purified water in a ratio of 1:1:15 to 1:4:20.

8. The method as set forth in claim 4, wherein the second etch process etches the field isolation film along with the floating gates.

9. The method as set forth in claim 4, wherein the first etch process is terminated once the field isolation film has a thickness of 50~200 Å as taken between the upper surface thereof and the bottom of the floating gates.

10. A method of fabricating a flash memory device, comprising:

providing a basic structure including a substrate, and a field isolation film protruding from the substrate;

forming a first conductive film on the substrate and planarizing the first conductive film to form floating gates on opposite sides of the field isolation film;

subsequently performing a first etch process that reduces the thickness of the field isolation film to expose upper portions of the floating gates;

while the upper portions of the floating gates are exposed, etching at least the exposed upper portions of floating gates with ammonium hydroxide, hydrogen peroxide, and purified water in a ratio of 1:1:15 to 1:4:20; and subsequently forming a dielectric film and a second conductive film in sequence on the resultant structure.

11. The method as set forth in claim 10, wherein the first etch process comprises etching the field isolation film with a fluoric acid.

12. The method as set forth in claim 10, wherein the first etch process comprises etching the field isolation film with hydrofluoric acid and ammonium fluoride in a ratio of 100:1 to 300:1.

13. A method of fabricating a flash memory device, comprising:

providing a basic structure including a substrate, and a field isolation film protruding from the substrate;

forming a first conductive film on the substrate and planarizing the first conductive film to form floating gates on opposite sides of the field isolation film;

subsequently performing a first etch process that reduces the thickness of the field isolation film, and terminating the first etch process before the upper surface of the field isolation film reaches the bottom of the floating gates to thereby expose upper portions of the floating gates;

while the upper portions of the floating gates exposed, performing a second etch process that is different from said first etch process and that etches the exposed upper portions of floating gates and the field isolation film; and subsequently forming a dielectric film and a second conductive film in sequence on the resultant structure.

14. The method as set forth in claim 13, wherein the first etch process comprises etching the field isolation film with a fluoric acid.

15. The method as set forth in claim 13, wherein the first etch process comprises etching the field isolation film with hydrofluoric acid and ammonium fluoride in a ratio of 100:1 to 300:1.

* * * * *